United States Patent [19]
Köck et al.

[11] Patent Number: 5,555,255
[45] Date of Patent: Sep. 10, 1996

[54] SURFACE-EMITTING LASER DIODE

[75] Inventors: Anton Köck; Erich Gornik, both of München, Germany

[73] Assignee: Siemens Aktiengesellschaft, Munich, Germany

[21] Appl. No.: 448,425

[22] PCT Filed: Nov. 24, 1993

[86] PCT No.: PCT/DE93/01113

§ 371 Date: Jun. 5, 1995

§ 102(e) Date: Jun. 5, 1995

[87] PCT Pub. No.: WO94/13043

PCT Pub. Date: Jun. 9, 1994

[30] Foreign Application Priority Data

Dec. 3, 1992 [DE] Germany ............ 42 40 706.0

[51] Int. Cl.⁶ ............................................. H01S 3/19
[52] U.S. Cl. ................................ 372/96; 372/46
[58] Field of Search ...................... 372/96, 92, 46

[56] References Cited

U.S. PATENT DOCUMENTS

| | | | |
|---|---|---|---|
| 5,038,356 | 8/1991 | Botez et al. | 372/45 |
| 5,068,868 | 11/1991 | Deppe et al. | 372/45 |
| 5,255,278 | 10/1993 | Yamanaka | 372/96 |

FOREIGN PATENT DOCUMENTS 0395315 10/1990 European Pat. Off. .
0442002 8/1991 European Pat. Off. .

OTHER PUBLICATIONS

Y. Suematsu et al., "Advanced Semiconductor Lasers", Proceedings of the IEEE, vol. 80, No. 3, Mar. 1992, pp. 383–397.

E. Gornik et al., "Surface Plasmon Enhanced Light Emission in GaAs/AlGaAs Light Emitting Diodes", Proceedings SPIE, vol. 1362 Physical Concepts of Materials for Novel Optoelectronic Device Applications II: Device Physics and Applications (Oct., 1990), pp. 1–13.

Japanese Abstract, "Semiconductor Light Generator", JP 60–123084, vol. 9, No. 280 (E–356) (2003) Nov. 8, 1985.

*Primary Examiner*—James W. Davie
*Attorney, Agent, or Firm*—Hill, Steadman & Simpson, A Professional Corporation

[57] ABSTRACT

A surface-emitting laser diode with an active layer (3) between contact layers (2, 4) and reflector arrangements (9, 19) provided for a vertical resonance condition, in which the surface of the semiconductor material is provided with a spatial periodic structure, which is intended for the excitation of surface plasmon polaritons, and is covered with a thin metal film (5).

6 Claims, 1 Drawing Sheet

SURFACE-EMITTING LASER DIODE

BACKGROUND OF THE INVENTION

1. Field of the Invention

The present invention relates to a surface-emitting laser diode having a particularly good directional characteristic with utilization of the excitation of surface plasmon paritons.

DESCRIPTION OF THE RELATED ART

A surface-emitting, radiation-producing semiconductor component, which is operated by means of excitation of surface plasmon polaritons, is described in European Patent Document EP-A-0 442 002. This component can be configured, in particular, as a laser diode. The structure is based on an emission mechanism by means of excitation and emission of surface plasmon polaritons, these being transverse electrical (TE) or transverse magnetic (TM) surface modes, which can propagate at the interface between two different media. With a suitable periodic structure of the interface, these modes can be excited using electromagnetic waves. The properties of light-emitting diodes, in particular laser diodes, can be improved using this emission mechanism. Loss mechanisms, which appear in conventional light-emitting components and limit the efficiency, can thus be avoided, at the same time the line width being considerably reduced and the external quantum yield being drastically increased. Directed radiation with a defined polarization can be achieved with a beam divergence of less than 6°. In this case, a spatial periodic structure of the surface of the semiconductor material, that is to say the semiconductor surface facing away from a substrate over which there is growth, and a thin metal film applied thereto are essential for the design of this structure. The surface modes are excited at the surface, facing away from the semiconductor material, of this metal film, with the result that light is radiated in a directed manner from the surface. The polarization direction results from the direction of the periodic arrangement of the surface unevennesses.

SUMMARY OF THE INVENTION

It is the object of the present invention to specify an improved surface-emitting laser diode having intense beam focusing and an adjustable radiation direction.

This and other objects and advantages of the invention are achieved by means of the laser diode made of semiconductor material with an active layer and with contacts for applying an operating current, in which the surface, facing away from the active layer, of the semiconductor material is provided with a spatial periodic structure, in which a metal film is applied at least to a region, provided with the spatial periodic structure, of the surface, in which the height of the spatial periodic structure and the length of each period of the spatial periodic structure, the minimum distance of the metal film from the active layer and the thickness of the metal film are dimensioned such that, during operation of the laser diode, surface modes are excited at the surface, facing away from the active layer, of the metal film by photons produced in the active layer, and in that the reflector arrangement for forming a vertical resonator is present as a layer or as a layer sequence on the side facing away from the spatial periodic structure of the active layer. Further refinements of the invention are characterized in that a further reflector arrangement is present between the active layer and the metal film.

The vertical resonator is bounded by the reflector arrangement and by the metal film in a preferred embodiment. The active layer is preferably arranged between contact layers which adjoin said active layer vertically with respect to the layer plane, and the spatial periodic structure is formed in the surface of a covering layer which is present between one of said contact layers and the metal film. The metal film may be applied in a recess of a contact. The metal film also forms a contact.

The laser diode according to the invention uses a layer structure, as is fundamentally known from conventional surface-emitting laser diodes having a vertical resonator. This structure is modified such that the radiation of light can take place by excitation of surface modes.

BRIEF DESCRIPTION OF THE DRAWINGS

There follows a description of the laser diode according to the invention using FIGS. 1 and 2, which each show an embodiment in an oblique sectional view.

DETAILED DESCRIPTION OF THE PREFERRED EMBODIMENTS

Figure 1:
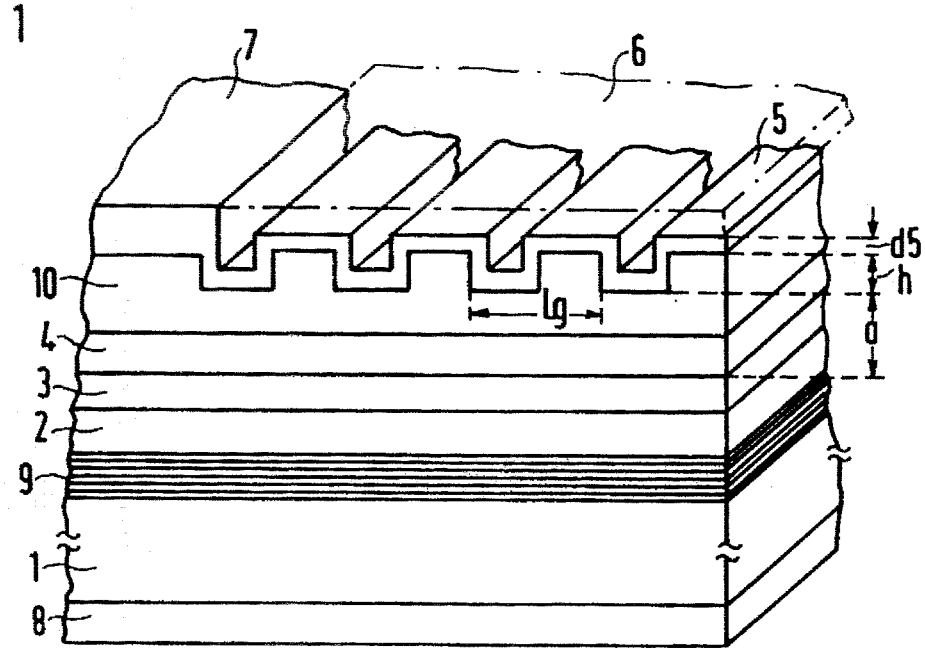

The laser diode according to the invention has a layer structure with an active layer 3 between contact layers 2, 4 provided for supplying power to the active layer 3. The entire layer arrangement is expediently grown onto a substrate 1. The spatial periodic structure necessary for the excitation of the surface modes is formed, for example by etching, in the surface of the semiconductor material. In the exemplary embodiment in FIG. 1, this surface is formed by the surface of a covering layer 10, which is grown onto the upper contact layer 4. A thin metal film 5, for example made of aluminum, gold or silver, is deposited on this structured surface. The thickness d5 of this metal film 5 can, for example, be so small that the metal film 5 is semitransparent. Typical thicknesses d5 of the metal film 5 are 0.01 μm to 0.1 μm.

Further dimensions of this structure of the surface which govern the excitation of the surface modes are illustrated in FIG. 1. What are essential are the length of a period Lg, the minimum distance a of the metal film 5 from the active layer 3 and the height h, that is to say the difference between the minimum distance and the maximum distance of the semiconductor surface coated with the metal film 5 from the active layer 3.

A vertical resonator is formed in this laser diode by arranging reflectors above and below the active layer 3 for producing a resonance condition in the direction extending vertically with respect to the layer planes. In the exemplary embodiment in FIG. 1, a reflector arrangement 9 is provided between the substrate 1 and the lower contact layer 2. The reflective metal film 5 forms the upper reflector. The reflector arrangement 9 can comprise a single layer or a layer sequence of successive semiconductor layers having a different refractive index and, advantageously, in each case having the thickness of a quarter-wavelength. It is particularly advantageous in the case of the laser diode according to the invention that a separate upper reflector arrangement can be omitted, because its function can already be assumed by the metal film 5. The covering layer 10 can then also be omitted and the structure can be formed in the surface of the upper contact layer 4. The contacts which are necessary for applying the operating current can be fitted, for example, in the manner indicated in the case of a conductive substrate 1. A contact 7 is then present on the top of the laser diode, which contact has a recess, in which only the thin metal film 5 is applied, in the region of the structure of the semiconductor surface. However, the metal film 5 can also be present across the whole area and it then suffices as a contact for the electrical connection. The mating contact 8 is situated on the bottom of the conductive substrate 1. The lower contact layer 2 can then be omitted and current can be injected into the active layer 3 through the reflector arrangement 9. If a contact layer 2 is present, the mating contact can be fitted directly on a surface of this contact layer over which surface there is no growth or which surface is etched to be exposed. The substrate 1 can then also be semi-insulating. In addition to the structure shown, the surface of the metal film 5 can be covered with a dielectric 6, as is indicated in FIG. 1 by the dot-dashed line. As is described in European Patent Document EP-A-0 442 002, such a layer of dielectric 6 serves to excite higher-order surface modes. This dielectric 6 can also be designed as a layer sequence of a plurality of different dielectrics.

Figure 2:
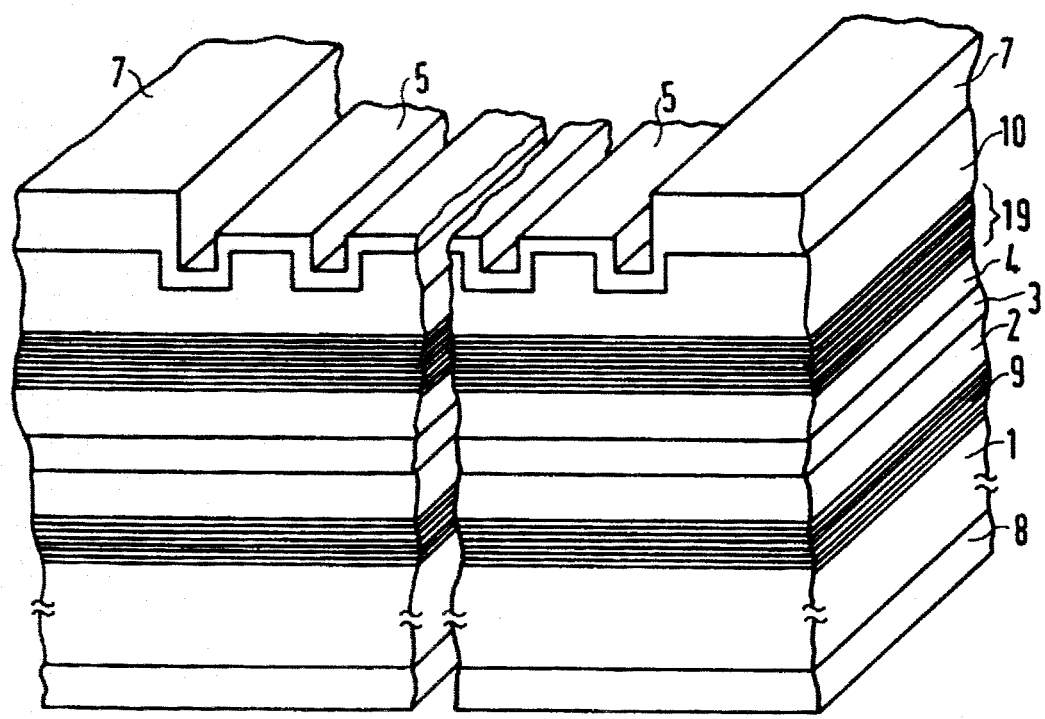

FIG. 2 shows an alternative embodiment, in which a dedicated reflector arrangement 19 is present above the active layer as well. This reflector arrangement 19 is situated between the upper contact layer 4 and the covering layer 10. In the case of a laser diode which is built using the material system of GaAs, the substrate is, for example, GaAs. The active zone 3 is likewise GaAs. The contact layers 2, 4 are AlGaAs. The covering layer 10 can likewise be AlGaAs. The reflector arrangements 9, 19 are advantageously a sequence of layers made alternately of AlGaAs and AlAs. The active layer 3 can also be designed as a quantum well structure. Using the material system of GaAs, an active layer 3 made of a layer sequence of layers made alternately of GaAs and InGaAs is then particularly advantageous. InGaAs has a smaller energy band gap than GaAs, with the result that the reflector arrangements 9, 19 can then be layer sequences of layers made alternately of AlAs and GaAs, and this simplifies the epitaxial growth. In a simplified design of this laser diode, the upper reflector arrangement and the covering layer 10 are omitted, and the spatial periodic structure of the surface of the semiconductor material is formed in the top, facing away from the active layer 3, of the upper contact layer 4. The upper reflector arrangement 19 is advantageously a sequence of layers having a different refractive index and in each case the thickness of a quarter-wavelength, or with radiation produced in the active layer.

A conventional surface-emitting laser diode radiates essentially perpendicularly with respect to the surface. Sharp beam focusing of the light radiation, as is carried out in the case of the laser diode according to the invention, can be achieved in a conventional laser diode only by additional optical measures, such as a lens. Light emission in different adjustable directions can additionally be achieved by means of surface mode emission using the laser diode according to the invention. The arrangement of the surface structure and the suitable selection of the dimensions specified above mean that directed radiation can be carried out at specific angles. In addition, the polarization plane of the emitted light can be adjusted. Limiting the periodic structure by means of the thicker upper contact 7 means that the region of radiation emission can be laterally limited. The design according to the invention is not restricted to the material system of GaAs. Since the attenuation of the surface modes decreases with increasing wavelength, the excitation and emission mechanism of the surface modes is particularly effective, especially in the infrared. It is necessary only for the grating period to be matched to the wavelength. For a given wavelength of the radiation produced in the active layer 3, the radiation direction is fixed by the grating period (period length Lg). The radiation direction can therefore be defined by the dimensioning of the periodic structure at the surface and the selection of the composition of the semiconductor material of the active layer 3. The periodic structure can be formed, as shown in the figures, by trenches aligned parallel to one another. There is no periodicity in the direction of these trenches. Instead of this embodiment, any structure described in European Patent Document EP-A-0 442 002 can be provided. In particular, it can be a cross grating, in which two sets are present, aligned perpendicularly with respect to one another, of trenches which are arranged parallel to one another and are in each case at equal distances from the nearest trenches. The structure is then periodic in each direction in the plane of the layer structure. The trenches can be replaced by sets, aligned in a crosswise manner, of webs, or the like, which are aligned parallel to one another and are in each case at equal distances from the nearest webs. The profile of the trenches or webs can be rectangular or rounded, pointed, sinusoidal or polygonal.

The laser diode according to the invention enables extremely focused surface emission in a predeterminable direction for a component structure which can be produced easily.

Although other modifications and changes may be suggested by those skilled in the art, it is the intention of the inventor to embody within the patent warranted hereon all changes and modifications as reasonably and properly come within the scope of his contribution to the art.

I claim:

1. A surface-emitting laser diode, comprising;

semiconductor material, an active layer in said semiconductor material, contacts on said semiconductor material for applying an operating current to said surface-emitting laser diode, a spatial periodic structure on a surface, facing away from the active layer, of the semiconductor material, a metal film applied at least to a region of the surface that is provided with said spatial periodic structure, said spatial periodic structure being of a height and a length of each period and a minimum distance of said metal film from the active layer and a thickness of the metal film being dimensioned such that, during operation of the laser diode, surface modes are excited at the surface, facing away from the active layer, of the metal film by photons produced in the active layer, and a reflector arrangement for forming a vertical resonator being at least one layer on a side, facing away from said spatial periodic structure, of the active layer.

2. A surface-emitting laser diode as claimed in claim 1, further comprising:.

a further reflector arrangement between the active layer and the metal film.

3. A surface-emitting laser diode as claimed in claim 1, wherein the vertical resonator is bounded by the reflector arrangement and by the metal film.

4. A surface-emitting laser diode as claimed in claim 3, wherein the active layer is arranged between said contact layers which adjoin said active layer vertically with respect to the layer plane, and further comprising:

a covering layer between one of said contact layers and the metal film, said spatial period structure being formed in said covering layer.

5. A surface-emitting laser diode as claimed in claim 1, wherein said contact defines a recess, and the metal film being in said recess of said contact.

6. A surface-emitting laser diode as claimed in claim 1, wherein said metal film forms said contact.

* * * * *